United States Patent [19]

Rydel

[11] Patent Number: 5,550,545
[45] Date of Patent: Aug. 27, 1996

[54] ELECTRONIC CIRCUIT HAVING A LINEARISED AND SYMMETRIZED RESPONSE, AN OSCILLATOR HAVING SUCH A CIRCUIT, AND A TELECONTROL TRANSMITTER HAVING SUCH AN OSCILLATOR

[75] Inventor: Charles Rydel, Paris, France

[73] Assignee: Valeo Electronique, Creteil Cedex, France

[21] Appl. No.: 222,708

[22] Filed: Apr. 4, 1994

[30] Foreign Application Priority Data

Apr. 5, 1993 [FR] France ................... 93 03990

[51] Int. Cl.⁶ .................................. G08C 19/12
[52] U.S. Cl. .................. 341/176; 340/825.69; 331/74
[58] Field of Search ..................... 341/176, 177, 341/173; 340/825.69, 825.7, 825.72; 331/74–77, 182–183; 455/114

[56] References Cited

U.S. PATENT DOCUMENTS

| | | | |
|---|---|---|---|
| 3,374,445 | 3/1968 | Gaunt, Jr. | 331/109 |
| 4,132,964 | 1/1979 | Wilcox | 331/116 |
| 5,136,263 | 8/1992 | Lane | 331/158 |
| 5,245,347 | 9/1993 | Bonta et al. | 342/149 |

FOREIGN PATENT DOCUMENTS 3401531  7/1985  Germany.

*Primary Examiner*—John K. Peng
*Assistant Examiner*—Andrew Hill
*Attorney, Agent, or Firm*—Morgan & Finnegan, L.L.P.

[57] ABSTRACT

An electronic circuit, more particularly an harmonic oscillator, is for example arranged as a transmitter for telecontrol signals, especially a remote transmitter for controlling devices such as door locks, anti-theft devices etc. in a motor vehicle. The circuit includes a device for linearising and symmetrizing the response of the amplifier of the harmonic oscillator, which is connected to the output of a means for generating telecontrol words, so as to reduce the output of harmonics.

18 Claims, 3 Drawing Sheets

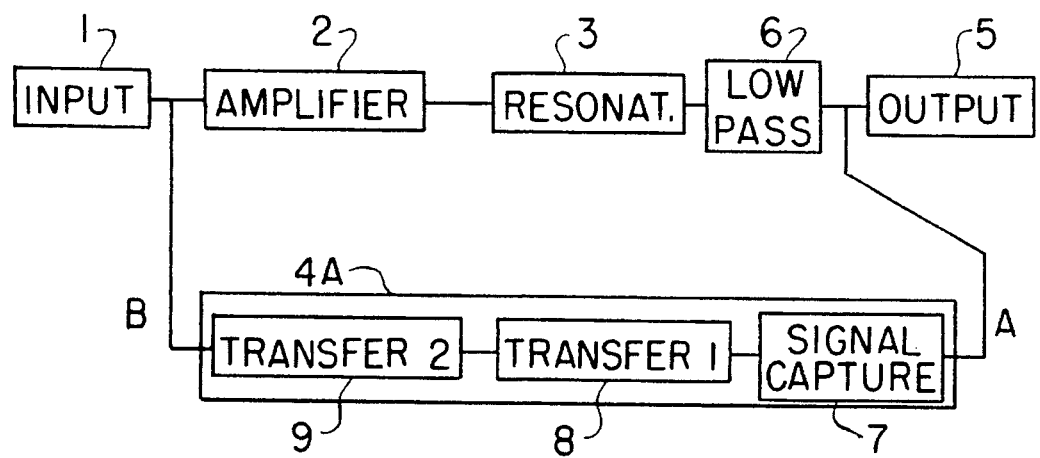
FIG. 6
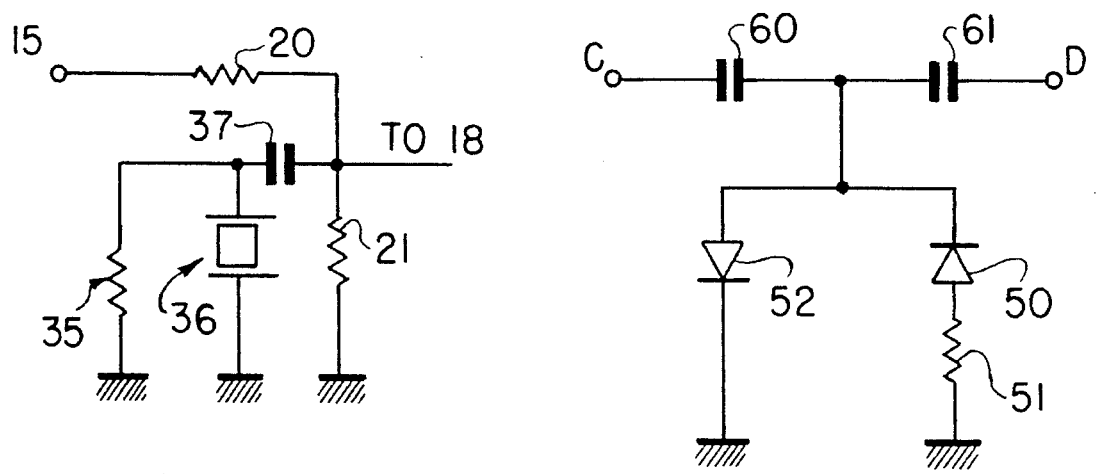
FIG. 8
FIG. 9

ELECTRONIC CIRCUIT HAVING A LINEARISED AND SYMMETRIZED RESPONSE, AN OSCILLATOR HAVING SUCH A CIRCUIT, AND A TELECONTROL TRANSMITTER HAVING SUCH AN OSCILLATOR

FIELD OF THE INVENTION

The present invention is concerned with electronic circuits requiring a linearised and symmetrized response. It is also concerned with an oscillator adapted to give a low output of harmonics. A particularly suitable application for the invention, though not the only one, is in a transmitter for telecontrol signals, i.e. for control signals which are transmitted to a remote receiver for actuation of a device, the signals being for example at radio frequencies.

BACKGROUND OF THE INVENTION

In the current state of the art, it is known to provide circuits having an operating point which is chosen in a linear zone of the current-voltage characteristic (i.e. the characteristic curve of current plotted against voltage). A circuit arranged in this way is known to produce responses which are substantially proportional to the input magnitude of the circuit. Such an electronic circuit may be of any kind that includes: impedence transformers: admittance transformers; voltage or current amplifiers; and/or oscillators.

However, the electronic circuits in the prior art are not satisfactory, especially when it is required to provide a circuit for a portable device having a power supply source which is of mediocre or uncertain stability. In particular, it is difficult in this case to reduce the parasitic elements in the spectrum radiated by the electronic circuit, without adding filters which increase its complexity, the dangers of thermal divergence, and its price.

DISCUSSION OF THE INVENTION

One object of the present invention is to provide a remedy for the above mentioned drawback of the prior art.

It has previously been proposed to provide electronic circuits which enable sinusoidal waves to be produced, these circuits being referred to as harmonic oscillators. Such oscillators, as already known, produce a low output of harmonics, and at their stable operating frequency they produce a signal which is reputed to contain fewer harmonics than other types of oscillator such as relaxation oscillators. However, it is known that harmonic oscillators do produce a certain amount of harmonics, in particular during their transition from the starting state to a permanent state; some harmonics are also produced in the permanent state.

In the current state of the art, it has already been proposed to symmetrize oscillator circuits, by symmetrization of the circuit with respect to a reference potential, as for example in a circuit of the push-pull type, enabling the even harmonics to be eliminated and also enabling the harmonic at the working frequency to be reinforced. However, the size of the frequency spectrum, in particular at radio frequencies, has become such that prevailing standards require increasingly greater weakening to be effected beyond the working frequency in the first harmonic, and therefore in an odd harmonic.

The present invention is especially suitable for application to a telecontrol signal transmitter, for example a telecontrol transmitter operating at radio frequencies, which includes a means for producing a code word comprising a plurality of signals in the form of pulses or peaks. Each peak has a predetermined duration, during which the harmonic oscillator is activated.

During the activation period, the oscillator must work at its stable operating frequency as rapidly as possible, and remain at that frequency without generating high harmonics in such a way that it would contaminate the electromagnetic environment.

In that arrangement, it can be seen that the generation of high harmonics is even stronger than for circuits which operate on a permanent basis, in particular because the period of the peaks may be as short as 10 microseconds. As a result, a frequency modulation is produced which may be prolonged within the spectrum.

One solution consists in constructing the circuitry so that the harmonic oscillator, whether or not it is symmetrized, is followed by a low pass filter which considerably weakens the harmonics starting with 2.Ft, if Ft is the working frequency of the harmonic oscillator, that is to say the first harmonic. However, this solution leads to an increase in the circuitry required, and therefore to a number of resulting drawbacks, for example:

an increase in the complexity of the circuit, which makes it more difficult to construct it as an integrated circuit;

an increase in the likelihood of errors occurring with age, or as a result of outside influences such as temperature;

an increase in electromagnetic susceptibility; and an increase in cost.

Another object of the present invention is to provide a novel class of oscillators, and particularly harmonic oscillators which are free of the above mentioned faults.

A further object of the invention is to provide a telecontrol transmitter capable of producing a telecontrol signal or transmission signal which is particularly pure and stable.

According to the invention in a first aspect, the electronic circuit includes in one of its input and output networks, or in a feedback path between the networks, a linearising and symmetrizing device comprising two components, the transfer functions of which are substantially inverse with respect to each other, and which are so connected that the resultant transfer function presents, in a characteristic curve of the circuit, in the vicinity of the operating point of the circuit, a point of inflexion with a linear portion of the curve on either side of the point of inflexion.

The invention also relates to an oscillator, for example an harmonic oscillator, the principal elements of which are:

an amplifier stage;

a resonating energy reservoir, for example a matched circuit; and a feedback loop which feeds back a predetermined fraction of the energy stored in the input of the amplifier stage.

According to the invention in a second aspect, such an harmonic oscillator is characterised in that the feedback loop includes a linearising and symmetrizing device comprising two components, the transfer functions of which are substantially inverse with respect to each other, and which are so connected that the resultant transfer function presents, in a characteristic curve of the circuit, in the vicinity of the operating point of the circuit, a point of inflexion with a linear portion of the curve on either side of the point of inflexion.

In one form of circuit in accordance with the invention, part of the matched circuit constitutes a low pass filter, the output of which constitutes the output of the oscillator itself.

The invention is also concerned with a telecontrol transmitter, especially one which is adapted for remote actuation of an apparatus having a suitable receiver, in particular at radio frequencies (though not necessarily). Such a transmitter is most particularly well adapted to the telecontrol of the locking and unlocking of doors and other opening elements, and/or of locking or disabling components of anti-theft systems, and/or of alarms, on vehicles.

According to the invention in a third aspect, such a telecontrol transmitter is characterised in that it includes a modulating signal generator, the output of which is connected to the input of the amplifier of an harmonic oscillator, the output of which is coupled to a radiating member such as a radio frequency antenna. This transmitter preferably includes an harmonic oscillator according to the present invention.

In one form of harmonic oscillator in accordance with the invention, the oscillator is of the Hartley type. In another form, it is of the Colpits type.

In other embodiments, the feedback loop is connected between the output of the resonator circuit and the base of an input transistor of the amplifier.

In further embodiments, the feedback loop is connected between the output of the resonator circuit and the emitter of a transistor of the amplifier.

In one form of circuit in accordance with the invention, the circuit is arranged so as to excite a source of optical or acoustic radiation, for example ultrasonic radiation.

In another form, the circuit is adapted so as to excite a source of radio frequency radiation, or an electrical signal which is transmitted through wiring or otherwise.

Further features and advantages of the present invention will appear more clearly on a reading of the detailed description of preferred embodiments of the invention which follows, and which is given by way of example only and with reference to the accompanying drawings.

BRIEF DESCRIPTION OF THE DRAWINGS

FIG. 6 is a block diagram for an harmonic oscillator in accordance with the present invention.

FIG. 8 is a circuit diagram showing a modification of part of the circuit in FIG. 7.

FIG. 9 shows an application of the device shown in FIG. 3 to the circuit of FIG. 7.

DESCRIPTION OF PREFERRED
EMBODIMENTS OF THE INVENTION

Figure 1:
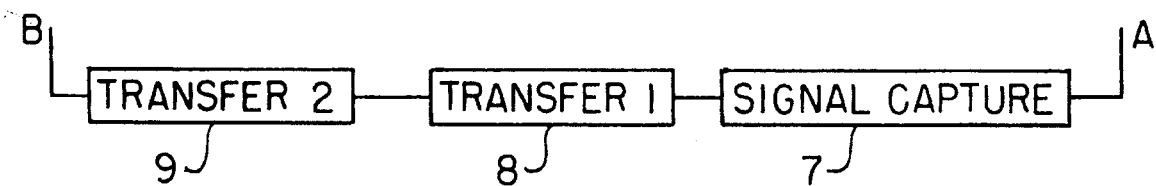
FIG. 1 is an operation diagram for a device in accordance with the invention.

FIG. 1 shows a linearising and symmetrizing device in accordance with the invention. The signal to be transformed is taken at A on a predetermined point of the electronic circuit through a signal capture means 7 which passes the signal, or selects the whole of the signal or a part of it, and which may be arranged to perform the adaptations that are made necessary by the introduction of the device into the circuit. The output of the signal capture means 7 is connected to the input of a first component 8 which is represented by a first transfer function with a predetermined current-voltage characteristic.

The output of the first component 8 is connected to the input of the second component 9, which is represented by a second transfer function with a predetermined current-voltage characteristic. The output from the second component 9 is reinjected at a predetermined point B of the circuit.

The choice of the points A and B depends on the function which it is required to linearise. Its selection is within the competence of a person skilled in this technical field, according to the problem which he wishes to solve using the device of the invention. The points A and B may be on an input port of the circuit, or on an output port of the circuit, or may indeed be in series in a feedback loop between the input port and the output port of the electronic circuit.

Figure 2:
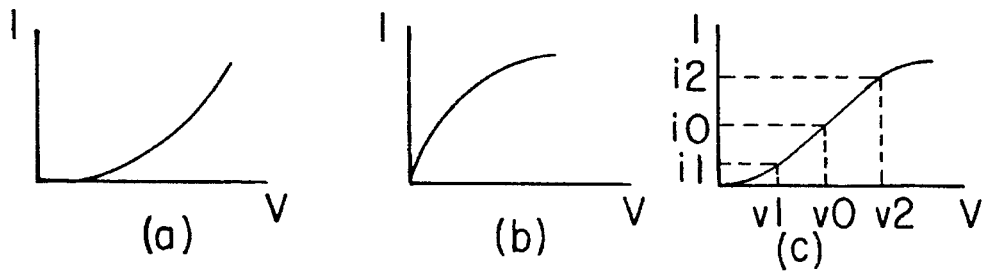
FIG. 2 gives at (*a*), (*b*) and (*c*) three current-voltage characteristics for a circuit according to the invention.

FIGS. 2*a* to 2*c* show voltage-current characteristics of the device of FIG. 1 which enable the object of the present invention to be achieved. In FIG. 2*a*, the current-voltage characteristic of the first component 8 has a rising monotonic form, in which the differential dI/dV increases with V.

In FIG. 2*b*, the current-voltage characteristic of the second component 9 has a rising monotonic form in which the differential dI/dV reduces with V.

By connecting the two components 8 and 9 in a suitable way, it can be expected that the resulting current-voltage characteristic shown in FIG. 2*c* has a point of inflexion at the point at which the effects of the two components are in equilibrium. Such a point, corresponding to a voltage V0 and a current I0, will be chosen as the central operating point of the corrected electronic circuit, and lies at the centre of a substantially linear zone of the characteristic, lying between the voltage values V1, V2 and the corresponding current values i1, i2. Within this range of variation, the circuit will have a linearised (i.e. a linear) response.

In addition, since the differentials or derivatives of the two transfer functions vary, it is clear that the two ends of the resulting characteristic can have a reduced or zero gradient which indicates a smoothing effect that gives automatic limitation of distortions.

It will also be noted that the suitable choice of two reciprocal components, such as two diodes connected in inverse relationship or back to back, or such as a diode and a base-emitter junction, enables a symmetrical response to be obtained on either side of the point of inflexion v0, i0. It will also be realised that although the characteristics chosen here by way of example are those of current with respect to voltage, other characteristics may be suitable for modification under the same conditions, according to the type of circuit involved.

Figure 3:
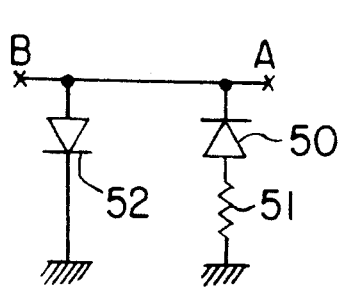
FIG. 3 is a circuit diagram for a first embodiment of a linearising and symmetrizing device in accordance with the invention.

Referring now to FIG. 3, this shows a first embodiment of a linearising and symmetrizing device in accordance with the invention. This device has a first component comprising a diode 50, the anode of which is connected to a first terminal of a resistor 51, with its cathode being connected to the input A. The second component of this device consists of a diode 52 which is identical to the first diode 50, and which is connected inversely with respect to the first diode between ground (earth) and the output B. The input A and output B are connected together.

The operation of this device will be described later on in this specification, in the context of its application to a telecontrol transmitter equipped with a linearised and symmetrized harmonic oscillator.

Figure 4:
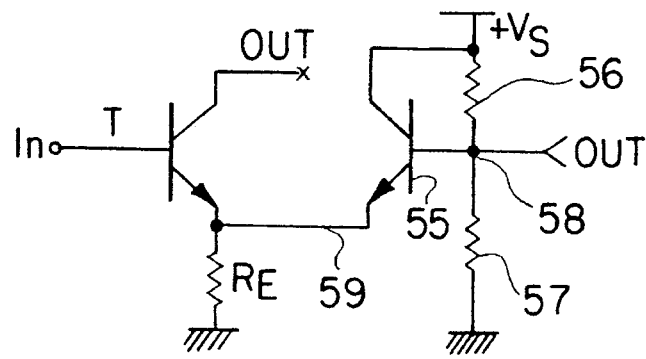
FIG. 4 is a circuit diagram for a second embodiment of a linearising and symmetrizing device in accordance with the invention.

Reference is now made to FIG. 4, which shows a second embodiment of the device in accordance with the invention, and in which the first component comprises a second NPN type transistor 55, which is added to a first NPN transistor substantially identical with it and already existing in the electronic circuit, in such a way that the two transistors are mounted differentially so as to present an emitter-collector junction in inverse relationship to the emitter-collector junction of the existing transistor.

To this end, the second transistor 55 is polarised by a bridge comprising resistors 56 and 57, which are connected between the positive supply terminal +Vs and ground. The input of the transistor 55 is connected to the output OUT of the first transistor T already existing. The output of the transistor 55 is taken on its emitter, which is itself connected so as to constitute a differential amplifier on the emitter of the transistor T. The transistor T is connected to ground through an emitter resistor RE. In this way, the two emitter-collector junctions of the transistors 55 and T are in opposition, and produce the desired effect in the context of a feedback of current from the output of the transistor T to its emitter. The response of the circuit is made linear and symmetrical about the operating point, in accordance with FIG. 2c.

Figure 5:
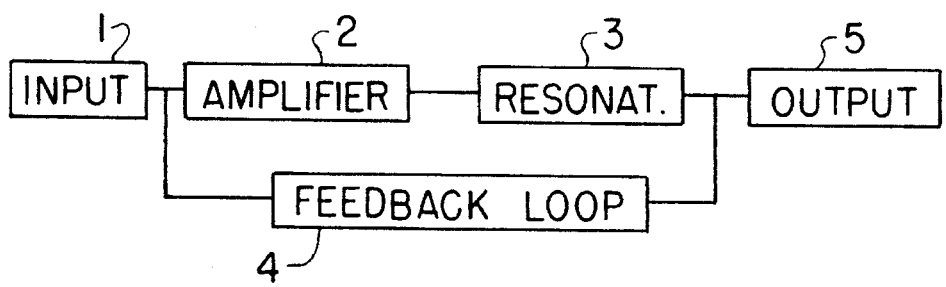
FIG. 5 is a block diagram of an harmonic oscillator in the current state of the art.

Reference is now made to FIG. 5, which is a block diagram showing the principle of an harmonic oscillator. Such an oscillator comprises an input stage 1 connected to the input of an amplifier 2 which serves for regenerating the energy consumed by the oscillator itself, by taking energy from an energy source not shown. The output of the amplifier 2 is connected to the input resonator circuit 3, which may for example comprise an inductance and capacitors, and which serves as an energy reservoir. The resonator circuit 3 may take various forms, such as Colpits structures or Hartley structures, or other well-known forms. Such a resonator includes reactances which enable reactive energy to be stored.

The output of the resonator 3 is connected to an output means 5, and also to the input end of a feedback loop, which takes part of the resonant energy from the resonator circuit 3 and passes it back into the input network of the amplifier.

Reference is now made to FIG. 6, which shows an harmonic oscillator which is equipped with the linearising and symmetrizing device described herein.

In addition, in previous patent application Ser. No. 08/221,472, filed Apr. 1, 1994, the present Applicants have sought to protect a novel low pass filter means for improving the spectral purity of an harmonic oscillator. The means that enables this result to be achieved is a modification of an existing circuit, and more particularly a modification of its dimensioning, such as to produce low pass filtering beyond the first harmonic. The resonant circuit itself includes inductive and capacitive elements of which a low pass filter is formed, this filter being adapted, not to produce an oscillator output filtered by a supplementary device (as in the case if the known prior art is applied), but to filter the output of the resonator circuit directly, by preventing it from resonating, or at the very least by limiting its power of resonance at higher frequencies.

The feedback network 4A, which is connected to the output of the low pass filter, enables the filtering effects to be multiplied, and therefore improves spectral purity in the output of the oscillator.

In addition, the feedback circuit is modified by means of the linearising and symmetrizing device as illustrated in FIG. 1, which is inserted in series in the loop 4A as above. For this reason, since the response of the harmonic oscillator is symmetrical and linear, this response gives rise to virtually no even harmonics, which renders it not absolutely necessary to provide the low pass filter arrangements 6 of FIG. 6. However, the concurrent arrangement of the filter 6 does enable some degree of supplementary flexibility to be preserved as regards the selection of values for the various parameters in the harmonic oscillator.

Figure 7:
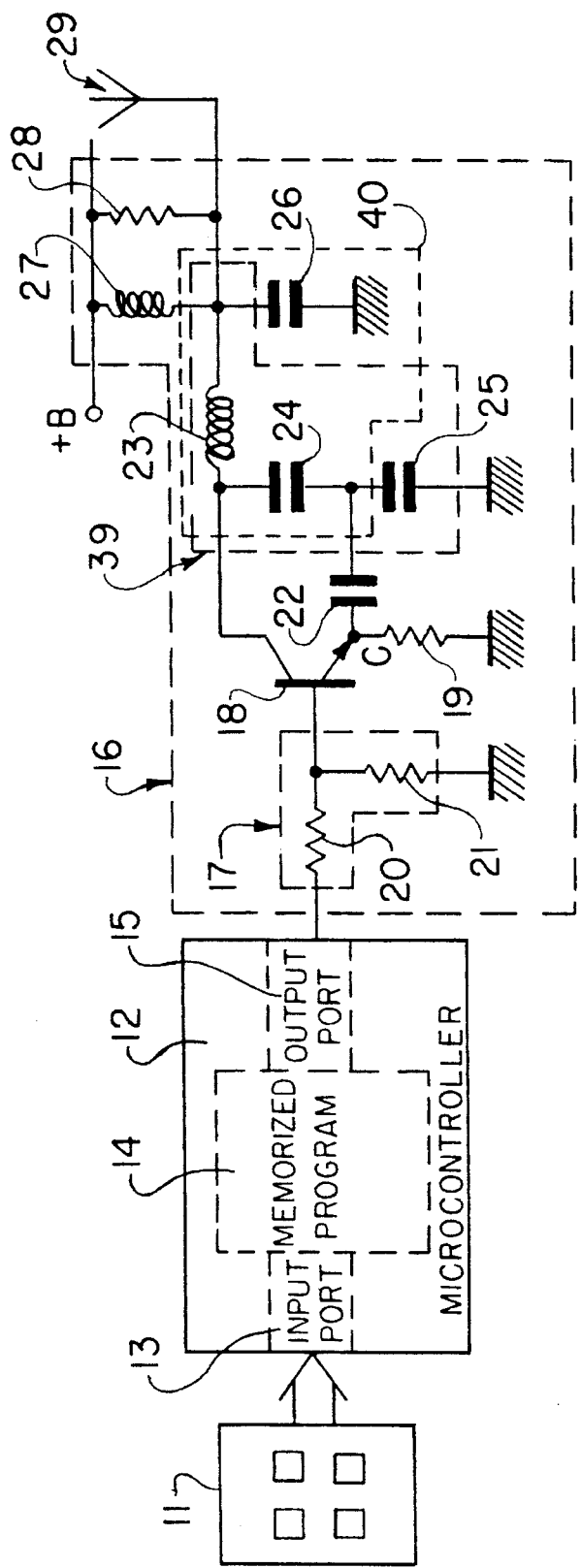
FIG. 7 is a circuit diagram for a telecontrol transmitter having an oscillator of the Colpits type incorporating features of the present invention.
Figure 10:
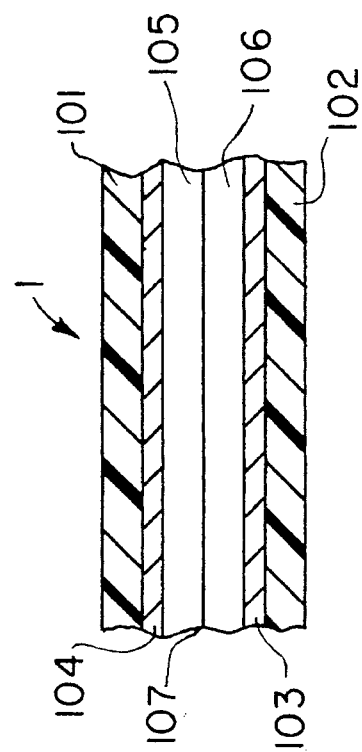
FIG. 10 shows a macrocomponent suitable for use in connection with the invention.

Referring now to FIG. 7, this shows a circuit for a telecontrol transmitter which employs an harmonic oscillator modified in accordance with the invention. The transmitter includes a microcontroller 12, having an input port 13 which decodes the telecontrol keypad 11. When the user depresses a key, or a sequence of keys on the keypad, or when the user produces a predetermined command, the input port 13 is put into a predetermined state which is decoded by means of a memorised programme 14 in the microcontroller 12.

The programme 14 then performs a coding routine for a telecontrol signal in the form of a series of voltage pulses (between 0 and 3 volts for example), having predetermined durations. Each pulse is produced by an output port 15 of the microcontroller 12, which serves as the input stage of an harmonic oscillator 16.

The oscillator 16 has an input stage 17, which in one embodiment comprises a first resistor 20 which is connected between the input of the oscillator and the input of the amplifier 18, together with a second resistor 21 which is connected between the input of the amplifier 18 and the electrical earth or ground of the circuit.

In a modification shown in FIG. 8, a control device is added to the input circuit 17. This control device comprises a resonating crystal 36, for example an acoustic surface wave resonating filter, in parallel with a resistor 35, so as to constitute a reference voltage generator which is also connected to the input of the amplifier 18. It may be connected to this input through a capacitive coupling which is provided by a capacitor 37. This type of circuit enables the harmonic oscillator to be fed with a stable resonant frequency generated by the crystal.

Reverting now to FIG. 7, this shows the amplifier of the harmonic oscillator 17, which here comprises an NPN transistor 18. The base of the transistor 18 is connected to the output of the input stage 17, and its emitter is connected to the electrical ground through a resistor 19. In addition, the output of the amplifier consists of the collector of the transistor 18, and is connected to the input of the circuit which acts as an energy reservoir, and which comprises a resonant circuit. This has a first branch comprising two capacitors 24 and 25 in series, and a second branch comprising an inductance 23.

In a modified embodiment, which corresponds to the above mentioned patent application, the resonator circuit, which in FIG. 7 is surrounded by a box in broken lines at 39, is completed by a capacitor 26 which is connected between one end of the inductance 23 and ground. Connected in this way, the capacitor 26, the inductance 23 and the capacitor 24 together constitute a "PI" low pass filter, which is indicated within a dotted line at 40 in FIG. 7.

The output 27, 28 of the oscillator is connected to the positive pole +B of a d.c. supply source such as an accumulator or a lithium dry battery, through a resistor 28. The output stage also includes a matched radio frequency antenna 29, which transmits the filtered radio waves produced by the oscillator.

The feedback loop in this example comprises a capacitive coupling, having a simple capacitor 22 connected to the common point between the two capacitors 24 and 25 on the one hand, and to the common point between the emitter of the transistor 18 and its emitter resistor 19. The base-emitter junction of the transistor 18 constitutes the feedback loop of the harmonic oscillator in this example; this makes it necessary to connect the resonator circuit 23 to 26 to the emitter through a capacitor 22.

In other embodiments, the feedback loop is closed on the base of the transistor 18 by means of a coupling capacitor.

In applying the linearising and symmetrizing device of the invention, the coupling capacitor 22 is replaced by two capacitors 60 and 61 shown in FIG. 9, these being connected in series with their common point connected to the point A of the device in FIG. 3. As a result, the first capacitor 61 has a high impedance at a predetermined frequency, so that the current in the diode 51 remains within an admissible range of values.

When a negative component of alternating voltage appears on the emitter of the transistor 18 (at the point C), the diode 50, in series with the resistor 51, causes the d.c. component stored in the capacitor 61 to become discharged. The capacitor 60 has a low value, for example ten times lower, than that of the capacitor 61.

During a positive component of the alternating voltage, the dynamic input resistance of the transistor 18 on the emitter increases. However, the dynamic resistance of the diode 52 diminishes because it is conducting. As a result, the diode 52 is in parallel with the transistor 18 for the duration of the positive component.

With a negative component of alternating voltage, the dynamic emitter resistance of the transistor 18 is reduced; and the diode 50, in series with the resistor 51, the value of which is high by comparison with the dynamic emitter resistance of the transistor 18 (and therefore by comparison with the network to be corrected), discharges the unidirectional component stored in the capacitor 61.

In one example in practice, it was measured that the second harmonic was weakened by 40 dB with respect to the first harmonic.

The capacitor preserves its function as a signal capture means in the feedback loop. In addition, it serves to cut the unidirectional component.

In one embodiment, the harmonic oscillator of the telecontrol transmitter includes a linearising and symmetrizing device which is constructed as described above with reference to FIG. 4. In such a circuit, a second transistor, identical to the transistor 18, is connected as a differential amplifier in the feedback loop, between the two capacitors 24 and 25 of the resonator circuit 39 and in place of the capacitive coupling 22.

In one embodiment shown in the drawings, the supply to the circuit is provided by an output means 5, which is represented in FIG. 7 by a coupling or damping inductance 27. This inductance is connected in parallel with a resistor 28, in such a way as to reduce the gain of the circuit so that it will not resonate with the inductance 27.

Reverting to FIG. 8, this shows an harmonic oscillator which is an oscillator of the Colpits type. Other resonating structures can be used, in particular by arranging the Colpits structure with a crystal oscillator as in FIG. 8, or again by using a reactance bridge, a Hartley structure, or a phase delay network. In that case, one of the elements of the resonating circuit has a value such that it constitutes a low pass filter, the cut-off frequency of which lies between the first and second harmonics.

In a preferred embodiment of the telecontrol transmitter of this invention, working in a radio frequency application, the electronic circuit is constructed as a macrocomponent 100 which consists of a printed circuit of the four-layer type, encapsulated in a suitable resin 101, 102, and provided with connectors for its electrical supply and for the output to its transmitting antenna.

The two outermost layers 103, 104 of the macrocomponent retain their conductive layer, with, in a modification, means for impedance adapting such as to reduce parasitic electromagnetic radiation and magnetic susceptibility. These layers provide screening and act as a heat radiator.

The two innermost layers 105, 106, which are protected by the two screening layers 103, 140, carry conductive strips together with the various components of the transmitter. The assembly includes its connectors 107 for electrical control, testing and diagnostic functions, so as to enable prototypes in particular to be developed, together with the signal output and the control inputs such as the input 17.

The transmission level is regulated by the diodes 50 and 51, and as a result there is no need to repeat the circuit diagram of the transmitter each time it is implemented in a communication or telecontrol system. The transmitter of the invention is thus designed as a component (or macrocomponent) which can be configured from outside by the professional user.

It will be clear that the telecontrol transmitter can be used as a transmitter for sinusoidal signals on any channel whatsoever, for instance:

- a hertzian link, such as is described above with reference to FIG. 7;
- a wire link, such as via screened cable, coaxial cable, twisted pairs, etc.; or
- an optical link, which may or may not employ a wave guide, and which may be of an acoustic type or an optical type in the visible or infrared spectrum, and so on, for the above mentioned applications.

What is claimed is:

1. An electronic circuit comprising: signal input means; signal output means; and a linearising and symmetrizing device connected between the input and output means, the linearising and symmetrizing device comprising a first component having a first transfer function characteristic, a second component having a second transfer function characteristic that is different from said first transfer function characteristic, and means for connecting said first and second components characteristics between the signal input means and output means in a substantially inverse relation with respect to each other, and whereby to define a resultant transfer function in the form of a characteristic curve defining an operating point for the circuit and such that it has a point of inflexion in the vicinity of said operating point and a substantially linear section of the curve on either side of said point of inflexion.

2. A circuit according to claim 1, wherein the linearising and symmetrizing device further comprises a signal capture means for taking signals from the circuit, the signal capture means being such as to perform at least one function selected from (a) selecting at least part of the whole signal, and (b) matching the characteristics of the linearising and symmetrizing device to the circuit.

3. A circuit according to claim 2, wherein the signal capture means has an output and each of said first and second components has an input and an output, the output of the signal capture means being connected to the input of the first component, the output of the first component being connected to the input of the second component, the output means of the device being coupled to the circuit for reinjecting the signals taken by said signal capture means into the circuit after said signals have been linearised and symmetrized by said components.

4. A circuit according to claim 3, wherein the transfer functions of the two said components, expressed as current-voltage characteristics, have a rising monotonic shape, with the gradients of the said characteristics of the said first and second components increasing and decreasing respectively with increase in voltage, whereby the said point of inflexion of the resultant transfer function in the form of a current-voltage characteristic curve lies at the point where the effects of the two said components are in equilibrium and at the centre of a substantially linear zone of the curve.

5. A circuit according to claim 4, such that the resultant characteristic curve has two end portions beyond the ends of the said substantially linear zone, said end portions being of smaller gradient than the latter, whereby to limit distortion automatically.

6. A circuit according to claim 2, wherein the two said components are selected reciprocally whereby to obtain a symmetrical response on either side of the said point of inflexion.

7. A circuit according to claim 2, wherein said first and second components comprise a first and a second diode respectively, the said diodes being substantially identical and being connected inversely to each other, the linearising and symmetrizing device defining an input and an output thereof which are connected together, the cathode of said first diode being connected to the said input of the device, the said device further including a resistor connected between the anode of said first diode and ground, and the second diode being connected between ground and said output of the device.

8. A circuit according to claim 2, further comprising an NPN type transistor constituting said second component of the linearising and symmetrizing device, the first component of the latter comprising a further NPN type transistor connected in added relationship to the said transistor and substantially identical therewith, the two said transistors being differentially connected so as to define an emitter-collector junction in inverse relationship with the emitter-collector junction of the transistor constituting the said second component.

9. A circuit according to claim 1, being an oscillator comprising: an amplifier stage having an input and an output; a resonating energy reservoir having an input and an output, the input of said reservoir being connected with the amplifier stage in series with it; and a feedback loop connected with the output of the said energy reservoir for taking a predetermined fraction of the energy stored in the latter and for feeding it back to the input of the amplifier stage, wherein the linearising and symmetrizing device is connected in the feedback loop.

10. An oscillator according to claim 9, wherein the said energy reservoir is a matched circuit including a low pass filter having an output which constitutes the output of the oscillator.

11. An oscillator according to claim 10 of the Hartley type, wherein the said energy reservoir is a resonator circuit having a first capacitor and an inductance, the said low pass filter comprising the said capacitor and inductance together with a filter capacitor.

12. An oscillator according to claim 10 of the Colpits type, the said energy reservoir being a resonator circuit having a first capacitor and an inductance, the said low pass filter being a "PI" filter comprising said first capacitor and inductance and a filter capacitor, connected to ground.

13. An oscillator according to claim 10, wherein the said energy reservoir is a resonator circuit, the amplifier having an input transistor, the feedback loop being connected between the output of the resonator circuit and the base of the said input transistor.

14. An oscillator according to claim 10, wherein the energy reservoir is a resonator circuit, the amplifier stage comprising a transistor, the feedback loop being connected between the output of the resonator circuit and the emitter of the said transistor.

15. An oscillator according to claim 10, wherein the energy reservoir is a resonator circuit, the oscillator further including power input means and a damping inductance connected between the power input means and the resonator circuit for power supply to the latter.

16. An oscillator according to claim 15, further including means for reducing the gain of the oscillator, the said load inductance being connected in the said gain reducing means in such a way that the oscillator cannot resonate on the said inductance, the said gain reducing means comprising a resistor connected in parallel with the said inductance.

17. A telecontrol transmitter according to claim 9 for remote control of a receiving apparatus, wherein the transmitter comprises a modulating signal generator having an output, said oscillator being an harmonic oscillator, an antenna, means for connecting the output of the modulating signal generator to the input of said amplifier, and means for coupling the output of said amplifier to said antenna.

18. A transmitter according to claim 17 for radio frequency operation, wherein the electronic circuit comprises a macrocomponent comprising a four-layer printed circuit encapsulated in resin and having: connectors for its electrical supply and for output connection to its antenna, two outer layers having conductive means constituting a radio frequency screen and a heat radiator; and two inner layers within the outer layers and protected thereby, the electrical components and connecting means of the transmitter circuitry being carried by the said inner layers.

* * * * *